United States Patent
Ishikawa et al.

(10) Patent No.: US 6,486,081 B1
(45) Date of Patent: Nov. 26, 2002

(54) GAS DISTRIBUTION SYSTEM FOR A CVD PROCESSING CHAMBER

(75) Inventors: Tetsuya Ishikawa, Santa Clara, CA (US); Padmanabhan Krishnaraj, Mountain View, CA (US); Feng Gao, Mountain View, CA (US); Alan W. Collins, San Francisco, CA (US); Lily Pang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/449,203

(22) Filed: Nov. 24, 1999

Related U.S. Application Data

(63) Continuation-in-part of application No. 09/191,346, filed on Nov. 13, 1998, now Pat. No. 6,143,078.

(51) Int. Cl.$^7$ ............................ H01L 21/31; H01L 21/469
(52) U.S. Cl. ........................ 438/788; 438/787; 438/789; 438/792
(58) Field of Search ................................ 438/787, 788, 438/789, 792; 118/719, 723 AW

(56) References Cited

U.S. PATENT DOCUMENTS

| | | | |
|---|---|---|---|
| 4,817,558 A | 4/1989 | Itoh ............................ | 118/725 |
| 4,949,669 A | 8/1990 | Ishii et al. .................... | 118/719 |
| 4,989,541 A | 2/1991 | Mikoshiba et al. .......... | 118/723 |
| 5,522,934 A | * 6/1996 | Suzuki et al. ............. | 118/723 A |
| 5,567,243 A | 10/1996 | Foster et al. ................ | 118/730 |
| 5,851,294 A | 12/1998 | Young et al. ................ | 118/715 |
| 5,851,600 A | 12/1998 | Horiike et al. .............. | 427/535 |
| 6,005,291 A | 12/1999 | Koyonagi et al. .......... | 257/751 |

FOREIGN PATENT DOCUMENTS

| | | | |
|---|---|---|---|
| EP | 0 807 694 A | 11/1997 | ............ C23C/16/44 |
| EP | 0877410 A1 | 11/1998 | ............ H01J/37/32 |
| EP | 0 877 410 | * 11/1998 | |
| EP | 0 892 083 A | 1/1999 | ............ C23C/16/44 |
| JP | 11-067907 | 9/1999 | ......... H01L/21/768 |
| WO | WO 98/00576 | 1/1998 | ............ C23C/16/50 |
| WO | 98/28465 | 7/1998 | ............ C23C/16/40 |

OTHER PUBLICATIONS

Decision on First Patent Examination by Intellectual Property Office of Taiwan, Ministry of Economic Affairs, dated Nov. 30, 2000; Application No. 088119093; Title: "Gas Distribution System for a CVD Processing Chamber".
PCT International Search Report dated Apr. 17, 2000.
EPO Search Report for EP No. 00125043.0, dated Mar. 30, 2001.

* cited by examiner

*Primary Examiner*—John F. Niebling
*Assistant Examiner*—Alexander G. Ghyka
(74) *Attorney, Agent, or Firm*—Thomason, Moser, & Patterson

(57) ABSTRACT

The present invention provides an apparatus for depositing a film on a substrate comprising a processing chamber, a substrate support member disposed within the chamber, a first gas inlet, a second gas inlet, a plasma generator and a gas exhaust. The first gas inlet provides a first gas at a first distance from an interior surface of the chamber, and the second gas inlet provides a second gas at a second distance that is closer than the first distance from the interior surface of the chamber. Thus, the second gas creates a higher partial pressure adjacent the interior surface of the chamber to significantly reduce deposition from the first gas onto the interior surface. The present invention also provides a method for depositing a FSG film on a substrate comprising: introducing first gas through a first gas inlet at a first distance from an interior surface of the chamber, and introducing a second gas through a second gas inlet at a second distance from the interior surface of the chamber, wherein the second gas creates a higher partial pressure adjacent the interior surface of the chamber to prevent deposition from the first gas on the interior surface. Alternatively, the first gas is introduced at a different angle from the second gas with respect to a substrate surface.

51 Claims, 10 Drawing Sheets

GAS DISTRIBUTION SYSTEM FOR A CVD PROCESSING CHAMBER

This application is a continuation-in-part of U.S. application Ser. No. 09/191,364, filed Nov. 13, 1998, now U.S. Pat. No. 6,143,078.

BACKGROUND OF THE INVENTION

1. Field of the Invention

The invention generally relates to an apparatus and a method for processing semiconductor substrates. More particularly, the invention relates to a method and apparatus for high density plasma chemical vapor deposition of films onto substrates.

2. Background of the Related Art

Plasma tools used for semiconductor processes, such as chemical vapor deposition (CVD), etching, reactive ion etching and so forth, typically employ either inductive coupling or capacitive coupling of a plasma generator to the processing chamber to strike and maintain a plasma. One advantage of inductively coupled plasmas over capacitively coupled plasmas is that the inductively coupled plasma is generated with a much smaller bias voltage on the substrate, reducing the likelihood of damage to the substrate. In addition, inductively coupled plasmas have a higher ion density thereby providing higher deposition rates and mean free paths, while operating at a much lower pressure than capacitively coupled plasmas. These advantages allow in situ sputtering and/or deposition during processing.

More recently, high density plasma (HDP) CVD processes have been used to provide a combination of chemical reactions and physical sputtering. HDP-CVD processes promote the disassociation of the reactant gases by the application of radio frequency (RF) energy to the reaction zone proximate the substrate surface, thereby creating a plasma of highly reactive ionic species. The high reactivity of the released ionic species reduces the energy required for a chemical reaction to take place, thus lowering the required temperature for these processes.

The goal in most HDP-CVD processes is to deposit a film of uniform thickness across the surface of a substrate, while also providing good gap fill between lines and other features formed on the substrate. Deposition uniformity and gap fill are very sensitive to the plasma generator source configuration, source radio frequency generator power, bias radio frequency generator power, process gas flow changes and process gas nozzle design, including symmetry in distribution of nozzles, the number of nozzles, the height of the nozzles disposed above the substrate during processing and the lateral position of the nozzles relative to the substrate deposition surface. These variables change as processes performed within the tool change and as process gases change.

FIG. 1 is a cross-sectional view of a HDP-CVD chamber useful for depositing a variety of films on a substrate. An example of a HDP-CVD chamber is the Ultima HDP-CVD system available from Applied Materials, Inc. of Santa Clara, Calif. Generally, the HDP-CVD chamber 100 comprises a chamber enclosure 102, a substrate support member 104, a gas inlet 106, a gas exhaust 108 and a dual coil plasma generator 110. The chamber enclosure 102 is typically mounted on a system platform or monolith, and an upper lid 112 encloses an upper portion of the chamber enclosure 102. A dome 114, typically made of a ceramic such as aluminum oxide ($Al_2O_3$), is disposed on the lid 112. The dual coil plasma generator 110 typically comprises a first and a second coil, 116, 118, and a first and a second RF power source, 120, 122, electrically connected to the first and second coils, 116, 118, respectively. To provide the high density plasma, the first coil 116 is disposed around the dome 114 while the second coil 118 is disposed above the dome 114. The gas inlet 106 typically comprises a plurality of gas nozzles 124 disposed around an interior circumference of the chamber in a region above the substrate support member. Typically, the gas nozzles 124 extend from the interior surface of the chamber to a distance above a substrate positioned on the substrate support member 104 to provide a uniform distribution of the processing gases to the substrate during processing. The gas exhaust 108 comprises a gas outlet 126 and a pump 128 to evacuate the chamber and control the pressure within the chamber during processing. During the deposition process, process gases are introduced through the gas inlet 106 and a plasma of the processing gases is generated within the chamber to effectuate chemical vapor deposition onto the substrate. The deposition typically occurs on all the surfaces exposed to the processing gases, including the interior surfaces of the chamber, such as the dome 114, because the processing gases are introduced at the same flow rate through gas nozzles 124 that have the same lengths to provide a uniform gas distribution within the chamber.

High density plasma (HDP) processes have become important processes used in the fabrication of integrated circuits. HDP processes can be used advantageously to deposit thin films or etch films on a substrate to form integrated circuits. As with other deposition and etch processes, an important consideration is the level of contaminants present in the processing environment. In HDP processes, this is important because the high density plasma typically creates higher temperatures within the process chamber. As the temperature in the process chamber increases, the likelihood that undesirable mobile ion and metal contaminants will be driven out of chamber components increases. Therefore, particle counts within the HDP process environment may be unfavorably high.

Particle contamination within the chamber is controlled by periodically cleaning the chamber using a plasma of cleaning gases, typically fluorinated compounds. Cleaning gases are selected based on their ability to bind the precursor gases and the deposition material which has formed on the chamber components in order to form stable products which can be exhausted from the chamber, thereby cleaning the process environment. In a high density plasma reactor, most cleaning gases containing fluorine (i.e., $NF_3$, $CF_4$, and $C_2F_6$) are highly dissociated and can readily bind the deposition material forming a stable product which can be exhausted from the chamber.

Typically, before the deposition process, the interior surfaces of the chamber are cleaned and then coated with a seasoning coat to protect these surfaces from the processing gases. The seasoning coat is typically formed by depositing the deposition material onto the surfaces within the chamber before a substrate is introduced into the chamber for processing. This step is typically carried out by depositing a film to coat the interior surfaces forming the processing region in accordance with the deposition process recipe.

As one process example, silane gas can be introduced into the chamber and oxidized to deposit a layer of silicon dioxide according to the following equation:

$$SiH_4 + O_2 \rightarrow SiO_2 + 2H_2 \qquad \text{EQUATION 1}$$

In a 200 mm substrate application, a deposition process is typically carried out using a source RF power up to about 4500 W and a bias RF power up to about 2500 W. The season step prior to deposition is carried out using a source RF up to about 4500 W and a bias RF up to about 1600 W. In a 300 mm substrate application, the deposition process is typically carried out using source RF up to about 10,125 W and a bias RF up to about 5625 W. The season step prior to deposition is carried out using a source RF up to about 10,125 W power and a bias RF power up to about 3600 W.

After processing a number of substrates, the seasoning coat is removed or cleaned from the interior surfaces of the chamber along with any material deposited on the seasoning coat, and a fresh seasoning coat is applied to the interior surfaces of the chamber to provide a clean, consistent environment for processing the next batch of substrates.

One problem encountered with deposition using the HDP-CVD chamber is that when the chamber is used to deposit a fluorine based film, such as fluorosilica glass (FSG), the fluorine in the plasma diffuses through the seasoning coat and attacks the ceramic ($Al_2O_3$) dome. The fluorine atoms that reach the ceramic dome react with the ceramic to form $Al_2O_xF_y$ (where x and y are integers) on the surface of the dome. It has been determined with Secondary Ion Mass Spectroscopy (SIMS) analysis that dome blackening and process drifts are caused by $Al_2O_xF_y$ formation on the dome. The $Al_2O_xF_y$ formation on the dome alters the electrical properties of the dome material and causes process drifts in the deposition uniformity, the deposition rate, the fluorine concentration and the sputter uniformity in the chamber. Because of the process drifts, non-uniform processing occurs across the surface of a substrate and from one substrate to another substrate.

As an attempt to solve the process drift problem and to prevent diffusion of the fluorine atoms through the seasoning coat, a thick seasoning coat (>1000 Å) is deposited prior to processing of each substrate. The thick seasoning coat prolongs the time required for the fluorine atoms to diffuse through the seasoning coat and reach the dome. However, when the process time is sufficiently long, the fluorine atoms are still able to diffuse through the seasoning coat to form $Al_2O_xF_y$ on dome and cause process drifts. Furthermore, an excess amount of time is spent depositing and removing the thick seasoning coats. The seasoning coat must be removed after a number of substrates have been processed to ensure that the fluorine atoms do not diffuse through the seasoning coat and form $Al_2O_xF_y$ on the dome, and a fresh seasoning coat must be deposited before the next batch of substrates are processed. The excess time spent in depositing and removing the thick seasoning coat is another major disadvantage because the throughput of the system is reduced.

Another problem associated with deposition of doped silicon glass using a HDP-CVD chamber is that the current gas distribution system does not provide uniform dopant delivery across the surface of the substrate, resulting in a deposited doped silicon glass film having material property differences across the surface of the substrate. In general, uniformity in processing is desired to maintain product quality.

Therefore, there exists a need for an apparatus and a method of depositing a film on a substrate that eliminates the contamination of the dome by fluorine and other gases and the resulting problems of process drifts. It would be desirable for the apparatus and the method to provide an increased throughput by reducing the time required for forming and removing the seasoning coat on the interior surface of the dome. It would be further desirable for the apparatus and the method to provide uniform dopant delivery across the surface of the substrate to achieve uniformly doped silicon glass films.

SUMMARY OF THE INVENTION

The present invention generally provides an apparatus and a method of depositing a film on a substrate that reduces the contamination of the dome by fluorine and the resulting problems of process drifts in the uniformity of deposition, deposition rate, fluorine content in the chamber during processing and the sputter uniformity. The apparatus and method also provide an increased throughput by reducing the time required for forming and removing the seasoning coat on the interior surface of the dome.

One aspect of the invention provides an apparatus for depositing a film on a substrate comprising a processing chamber, a substrate support member disposed within the chamber, a first gas inlet, a second gas inlet, a plasma generator and a gas exhaust. The first gas inlet delivers a first gas at a first distance from an interior surface of the chamber, and the second gas inlet delivers a second gas at a second distance that is closer than the first distance from the interior surface of the chamber. Thus, the second gas creates a higher partial pressure adjacent the interior surface of the chamber to significantly reduce deposition from the first gas onto the interior surface. As an example, for deposition of fluorine doped silica glass (FSG), the second gas comprises oxygen while the first gas comprises $SiH_4$, $SiF_4$, and argon. Because a higher partial pressure is created by the oxygen, fluorine ions from the first gas are impeded from depositing and diffusing through the seasoning coat to an interior surface of the chamber, such as the ceramic dome, resulting in elimination of the problems of process drifts caused by fluorine contamination of the dome. Alternatively, the first gas inlet is disposed at a different angle from the second gas inlet with respect to a substrate surface. Additionally, the invention provides an increased throughput by reducing the time required for forming and removing the seasoning coat on the interior surface of the dome.

Another aspect of the invention provides a method for depositing a film on a substrate comprising providing a chemical vapor deposition chamber, introducing a first gas and a second gas into the chamber and generating a plasma of the processing gases. The first gas is introduced through a first gas inlet at a first distance from an interior surface of the chamber, and the second gas is introduced through a second gas inlet at a second distance that is closer than the first distance from the interior surface of the chamber. Thus, the second gas creates a higher partial pressure adjacent the interior surface of the chamber to decrease deposition from the first gas on the interior surface. Alternatively, the first gas is introduced at a different angle from the second gas with respect to a substrate surface to achieve the same objectives. Preferably, the first gas is angled toward the substrate while the second gas is angled toward the dome.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
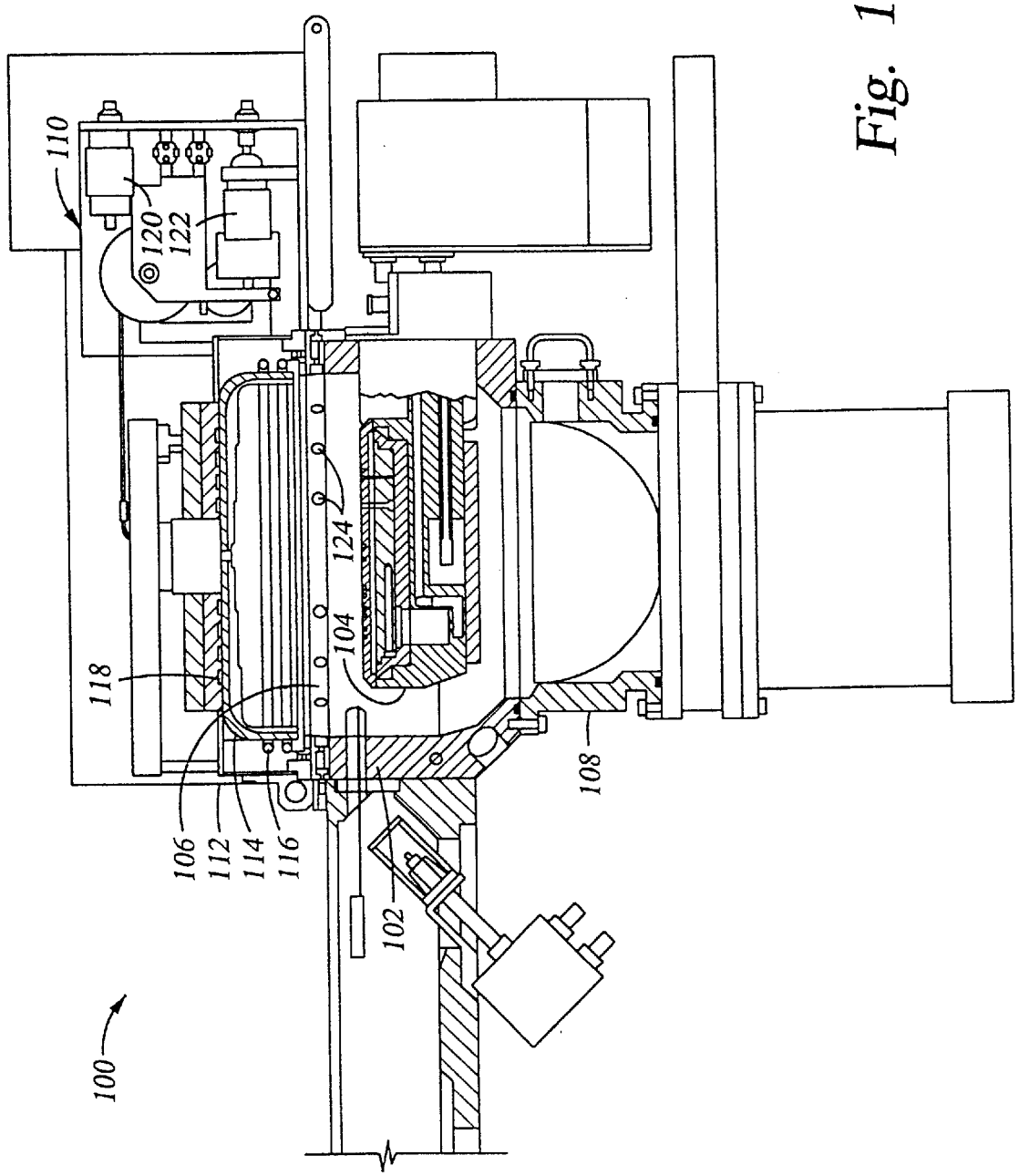
FIG. 1 is a cross-sectional view of a HDP-CVD chamber useful for depositing a variety of films on a substrate.
Figure 2:
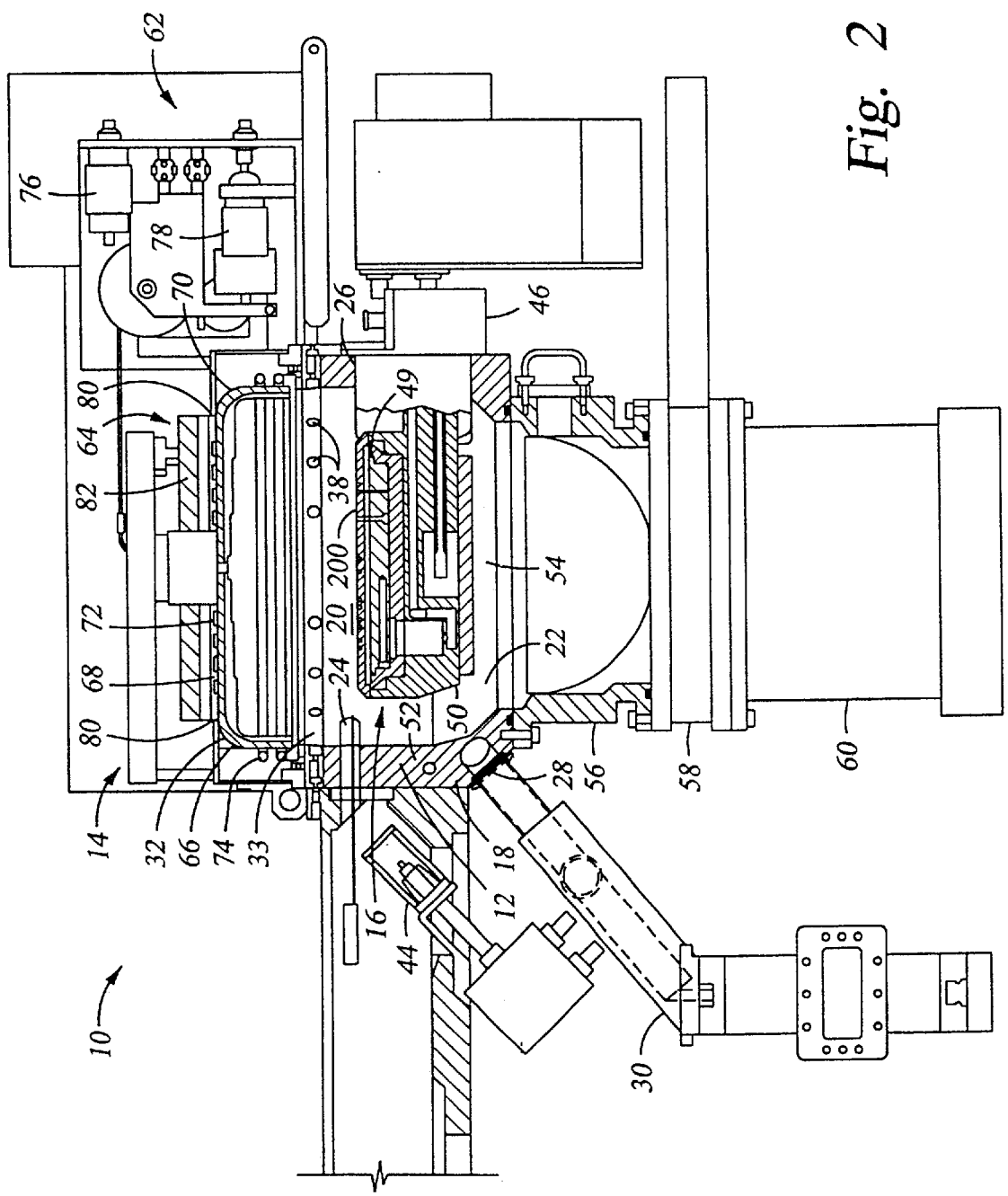
FIG. 2 is a cross-sectional view of a processing tool 10 of the present invention.

FIG. 2 is a cross-sectional view of a processing tool 10 of the present invention. Preferably, the processing tool is a high density plasma chemical vapor deposition chamber. The processing tool 10 generally includes a chamber body 12, a lid assembly 14 and a substrate support member 16 which defines an evacuable enclosure for carrying out substrate processing. The chamber body 12 is preferably a unitary, machined structure having a sidewall 18 which defines an inner annular processing region 20 and tapers towards its lower end to define a concentric exhaust passage 22. The chamber body 12 defines a plurality of ports including at least a substrate entry port 24 that is selectively sealed by a slit valve 44 and a side port 26 through which the cantilever mounted substrate support member 16 is disposed. The substrate entry port 24 and the support member port 26 are preferably disposed through opposite sides of the chamber body 12.

Two additional side ports (not shown) are disposed on opposite sides of the chamber wall 18 at about the level of the upper surface of the substrate support member 16 and are connected to a gas channel 28 formed in the chamber wall 18. Cleaning gases, such as disassociated fluorine containing gases, are introduced into the channel 28 from a remote plasma source 30 and into the chamber through the side ports. The location of the openings of the ports into the chamber are provided to direct gases towards areas of the reactor where heavy build-up occurs.

The upper surface of the chamber wall 18 defines a generally flat landing area on which a base plate 33 of the lid assembly 14 is supported. One or more o-ring grooves are formed in the upper surface of the wall 18 to receive one or more o-rings to form an airtight seal between the chamber body 12 and the base plate 33.

The chamber lid assembly 14 is generally comprised of an energy transmitting dome 32, an energy delivery assembly 62 and a temperature control assembly 64 supported on a hinge mounted base plate 33. The base plate 33 defines an inner annular channel in which a gas distribution ring is disposed. O-ring grooves are formed in the top of the gas distribution ring to receive an o-ring to seal the dome 32 and the top of the gas distribution ring. The lid assembly 14 provides both the physical enclosure of the plasma processing region as well as the energy delivery system to drive processing. A cover is preferably provided over the entire lid assembly to house the various components.

The dome 32 is generally comprised of a cylindrical sidewall 66 which is closed on one end by a flat top 68. The cylindrical sidewall 66 is generally perpendicular to the upper surface of the substrate support member 16 and the planar top 68 is generally parallel to the upper surface of the support member 16. The junction 70 between the sidewall and the top is rounded to provide a curved inner wall of the dome 32. The dome 32 is made of a dielectric material which is transmissive to RF energy, preferably a ceramic such as aluminum oxide ($A_2O_3$).

Two separately powered RF coils, a top coil 72 and a side coil 74, are wound external to the dielectric dome 32. The side coil 74 is preferably covered by a ground shield to reduce electrical crosstalk between the coils 72 and 74. The RF coils 72 and 74 are powered by two variable frequency RF sources 76 and 78.

Each power source includes a control circuit which measures reflected power and which adjusts a digitally controlled synthesizer in the RF generator to sweep frequencies, typically starting at 1.8 MHz, to minimize the reflected power. When the plasma ignites, the circuit conditions change because the plasma acts as a resistor in parallel with the coil. At this stage, the RF generator continues to sweep the frequency until a minimal reflected power point is again reached. The power source circuitry is designed so that each set of windings resonates at or near the frequency at which the minimum reflected power point is reached, so that the voltage of the windings is high enough to drive sufficient current to sustain the plasma. Thus, frequency tuning guarantees that the system remains close to resonance even if the resonance point of the circuit changes during processing. In this way, frequency tuning eliminates the need for circuit tuning and impedance matching by varying the values of impedance matching components (e.g., capacitors or inductors).

Each power source ensures that the desired power is delivered to the load despite any impedance mismatches, even continuously varying impedance mismatches which can arise due to changes in the plasma impedance. To ensure that the correct power is delivered to the load, each RF generator dissipates the reflected power itself and increases the output power so that the delivered power remains at the desired level. A RF matching network is typically used to transfer power to the plasma. The dual coil arrangement, when properly tuned to a substrate being processed, can control of the radial ion density profiles in the reaction chamber and generate uniform ion density across the substrate surface. Uniform ion across the substrate surface contributes to the uniform deposition and gap-fill performance onto the wafer and helps alleviate plasma charging of device gate oxides due to nonuniform plasma densities. When the action of the coils is superimposed, uniform plasma density results and deposition characteristics may be vastly improved.

The dome 32 also includes a temperature control assembly 64 to regulate the temperature of the dome during the various process cycles, i.e., deposition cycle and cleaning cycle. The temperature control assembly generally comprises a heating plate 80 and a cooling plate 82 disposed adjacent each other and preferably having a thin layer of a thermally conductive material, such as grafoil, disposed therebetween. Preferably, about a 4 mil to about 8 mil layer of grafoil is disposed therebetween. A thermally conductive plate 86, such as an AlN plate, is provided with grooves formed in its lower surface to house the coil 72. A second layer of grafoil, preferably about 1 to about 4 mils thick, is disposed between the thermally conductive plate 86 and the heating plate 80. A third thermally conductive layer is disposed between the coil 72 and the dome 32. The third layer is preferably a layer of chromerics having a thickness of about 4 mils to about 8 mils. The thermally conductive layers facilitate heat transfer to and from the dome 32. It is preferred to heat the dome during cleaning and cool the dome during processing.

The cooling plate 82 includes one or more fluid passages formed therein through which a cooling fluid, such as water, is flowed. The water channel in the cooling plate is preferably connected in series with cooling channels formed in the chamber body. A pushlock type rubber hose with quick disconnect fittings supplies water to the chamber body and the cooling channel in the lid. The return line has a visual flowmeter with an interlocked flow switch. The flowmeter is factory calibrated for a 0.8 gpm flow rate at a pressure of about 60 psi. A temperature sensor is mounted on the dome to measure the temperature thereof.

The heating plate 80 preferably has one or more resistive heating elements disposed therein to provide heat to the dome during the cleaning phase. Preferably the heating plate is made of cast aluminum, however other materials known in the field may be used. A controller is connected to the temperature control assembly to regulate the temperature of the dome.

By direct conduction, the heating plate 80 and the cooling plate 82 are used to control the dome temperature. Control of the dome temperature to within $\approx 10°$ K improves wafer to wafer repeatability, deposition adhesion and has been found to reduce flake or particle counts in the chamber. The dome temperature is generally kept within the range of from about 100° C. to about 200° C. depending on processing requirements. It has been shown that higher chamber clean rates (etch rates) and better film adhesion to the substrate can also be obtained at higher dome temperatures.

Figure 3:
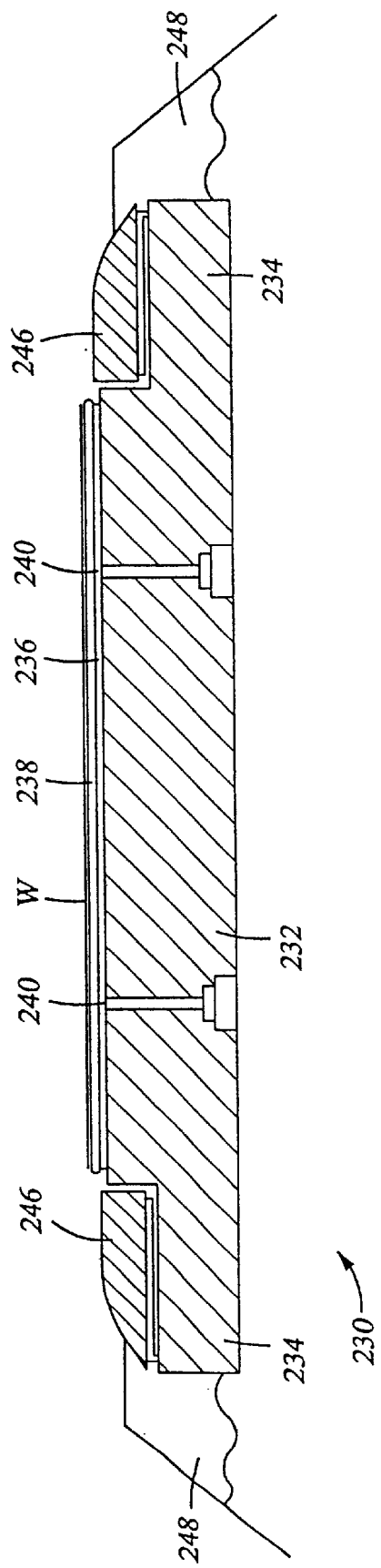
FIG. 3 is a partial cross-sectional view of a substrate support member and a processing kit for the substrate support member.

FIG. 3 is a partial cross-sectional view of a substrate support member and a processing kit for the substrate support member. Preferably, the substrate support member comprises an electrostatic chuck 230. The electrostatic chuck 230 comprises a support body 232 preferably fabricated as an integral block from an electrically conducting material having a high thermal mass and good thermal conductivity to facilitate absorption of heat from a wafer cooled over its upper surface. Aluminum or anodized aluminum is the preferred material for support body 232 because it has a high thermal conductivity of approximately 2.37 watts/cm-° C. and it is generally process compatible with the semiconductor wafer. Support body 232 may comprise other metals, such as stainless steel or nickel, and support body 232 may comprise an additional non-conducting material or the entire support body 232 may comprise a non-conducting or semiconducting material. In an alternative embodiment, support body 232 comprises a monolithic plate of ceramic. In this configuration, the ceramic plate incorporates a conducting element imbedded therein. The conducting element may comprise a metallic element, green printed metalization, a mesh screen or the like. A smooth layer dielectric material 236 covers an upper surface 238 of the support body 232 to support a substrate or wafer W during processing. A voltage, preferably about 700 Volts, is applied to the substrate support assembly 230 by a DC voltage source (not shown) to generate the electrostatic attraction force which holds a wafer W in close proximity to the upper surface of support body 232.

The substrate support body 232 include lift pin holes 240 to allow lift pins to extend through the support body and lift a substrate above the substrate support member to effectuate substrate transfer. An annular mounting flange 234 extending outwardly from the outer surface of support body 232 to support a ceramic collar 246 that prevents or inhibits the plasma in the processing chamber from contacting, and thereby eroding, part of the electrostatic chuck. A ceramic cover 248 serves as an outer jacket for covering and protecting the lateral surface of the support body 232 from the plasma during processing. The ceramic cover 248 also holds the collar 246 on the flange 234.

Referring back to FIG. 2, the substrate support member 16 partially extends through the side access port 26 formed in the chamber wall 18 and is mounted to the chamber wall 18 on a flange 46 to provide a generally annular substrate receiving surface 200 in the center of the chamber. The substrate support member 16 also includes a temperature control system that maintains the temperature of a substrate during processing. The temperature control system preferably comprises fluid channels 49 within the substrate support member that are connected to a thermal fluid source (not shown) and a controller (not shown), such as a microprocessor, that senses the temperature of the substrate and changes the temperature of the thermal fluid accordingly. Alternatively, other heating and cooling methods, such as resistive heating, may be utilized to control the temperature of the substrate during processing.

When the support member 16 is positioned in the chamber, an outer wall 50 of the annular support member 16 and an inner wall 52 of the chamber define an annular fluid passage 22 that is substantially uniform about the entire circumference of the support member 16. It is preferred that the passage 22 and the exhaust port 54 be substantially concentric with the substrate receiving surface of the support member. The exhaust port 54 is disposed substantially centrally below the substrate receiving portion of the support member 16 to draw the gases evenly through the passage 22 and out of the chamber. This enables more uniform gas flow over the substrate surface about the entire circumference thereof and radially downwardly and outwardly from the chamber through exhaust port 54 centered in the base of the chamber. The passage 22 promotes uniform deposition of film layers by maintaining pressure and residence time uniformity, lacking in existing processing chambers, such as substrate locations with differing proximity in relation to the pumping port.

A pumping stack comprising a twin blade throttle assembly 56, a gate valve 58 and a turbomolecular pump 60 is mounted on the tapered lower portion of the chamber body to provide pressure control within the chamber. The twin blade throttle assembly 56 and the gate valve 58 are mounted between the chamber body 12 and the turbomolecular pump 60 to allow isolation via gate valve 58 and/or pressure control at pressures of from about 0 to about 100 milliTorr as determined by settings of the twin blade throttle assembly 56. A 1600 L/sec turbo pump is a preferred pump, however, any pump which can achieve the desired pressure in the chamber can be used. A foreline 57 is connected to the exhaust port 54 at positions upstream and downstream from the turbo pump. This provides backing pump capability. The foreline is connected to the remote mainframe pump, typically a roughing pump. A port 59 is formed in the pumping stack to mount a flange 61 of the foreline. During chamber cleaning, cleaning gases are flown into the chamber at a high rate, thereby increasing the pressure in the chamber. In one aspect of the invention, therefore, the turbo pump is isolated from the chamber by the gate valve 58 and the mainframe pump is used to maintain the pressure in the chamber during the cleaning process.

During processing of a substrate in the chamber, the vacuum pump evacuates the chamber to a pressure in the range of about 4 to about 6 milliTorr, and a metered flow of a process gas or gases is supplied through the gas distribution assembly and into the chamber. The chamber pressure is controlled by directly measuring the chamber pressure and feeding this information to a controller that opens and closes the valves to adjust pumping speed. Gas flows and concentrations are controlled directly by mass flow controllers through a software set point provided in a process recipe. By measuring the flow rate of gases being pumped out of the chamber through the exhaust port 54, a mass flow controller (not shown) on the inlet gas supply can also be used to maintain the desired pressure and gas concentration in the chamber.

Figure 4:
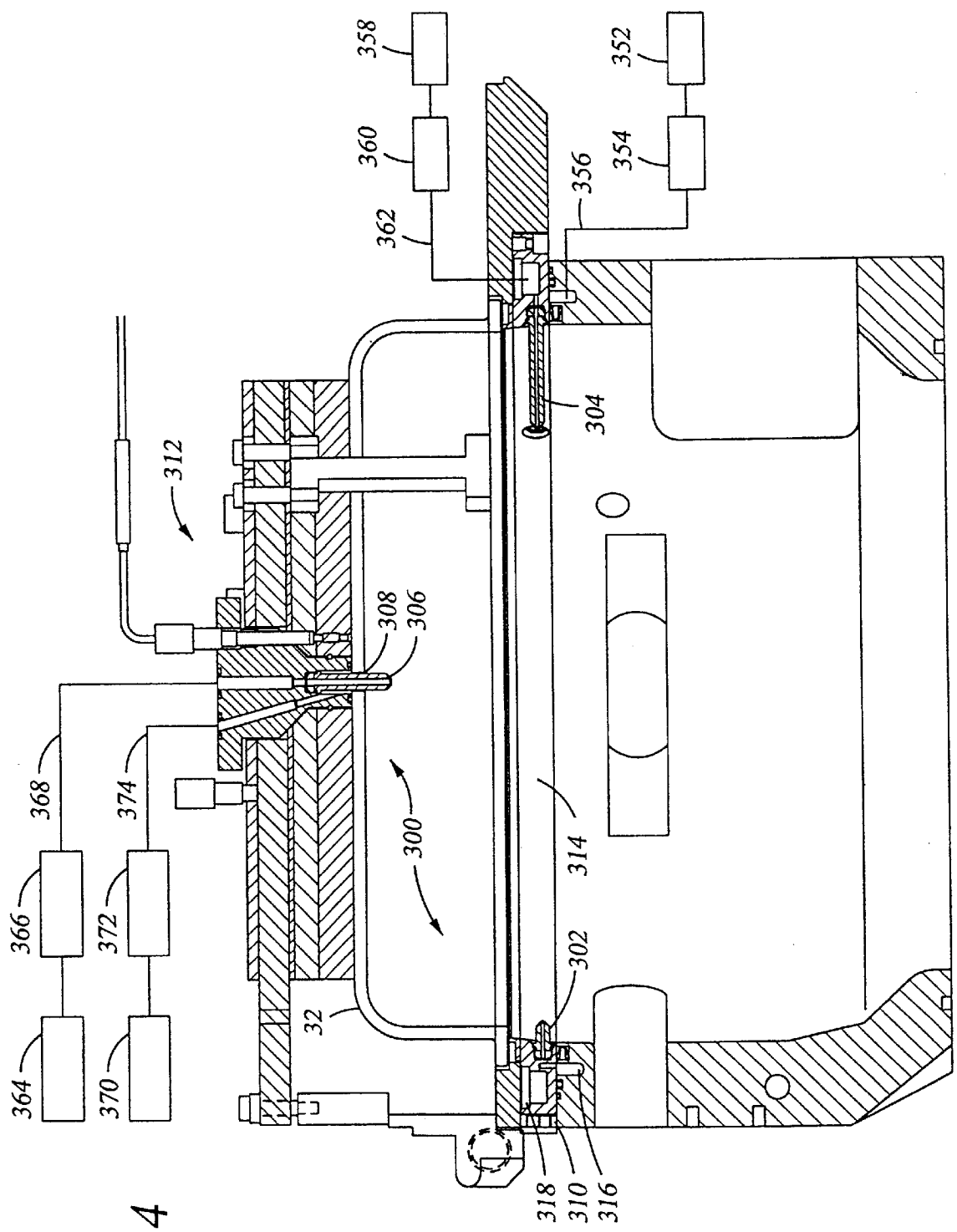
FIG. 4 is a cross-sectional view through a chamber of the present invention showing the gas distribution assembly 300.

The gas distribution assembly 300 will be described below with reference to FIGS. 4–8. FIG. 4 is a cross-sectional view through a chamber of the present invention showing the gas distribution assembly 300. Generally, the gas distribution system comprises an annular gas distribution ring 310 disposed between the lower portion of the dome and the upper surface of the chamber body and a centrally located center gas feed 312 positioned through the top of the dome. Gases are introduced into the chamber through both circumferentially mounted gas nozzles 302, 304 located near the bottom of the dome 32, and a centrally located gas nozzle 306 located in the top plate of the dome. One advantage of this configuration is that a plurality of different gases can be introduced into the chamber at select locations within the chamber via the nozzles 302, 304, 306. In addition, another gas, such as oxygen, or a combination of gases such as oxygen and $SiF_4$, can be introduced along side nozzle 306 through a gas passage 308 disposed around nozzle 306 and mixed with the other gases introduced into the chamber.

Generally, the gas distribution ring 310 comprises an annular ring made of aluminum or other suitable material 314 having a plurality of ports 311 formed therein for receiving nozzles and which are in communication with one or more gas channels 316, 318. Preferably, there are at least two separate channels formed in the gas ring to supply at least two separate gases into the chamber. Each of the ports 311 is connected to one of the gas distribution channels (either 316 or 318) formed in the ring. In one embodiment of the invention, alternating ports are connected to one of the channels, while the other ports are connected to the other channel. This arrangement allows for the introduction of separate gases, such as $SiH_4$ and $O_2$, separately into the chamber, as one example.

Figure 5:
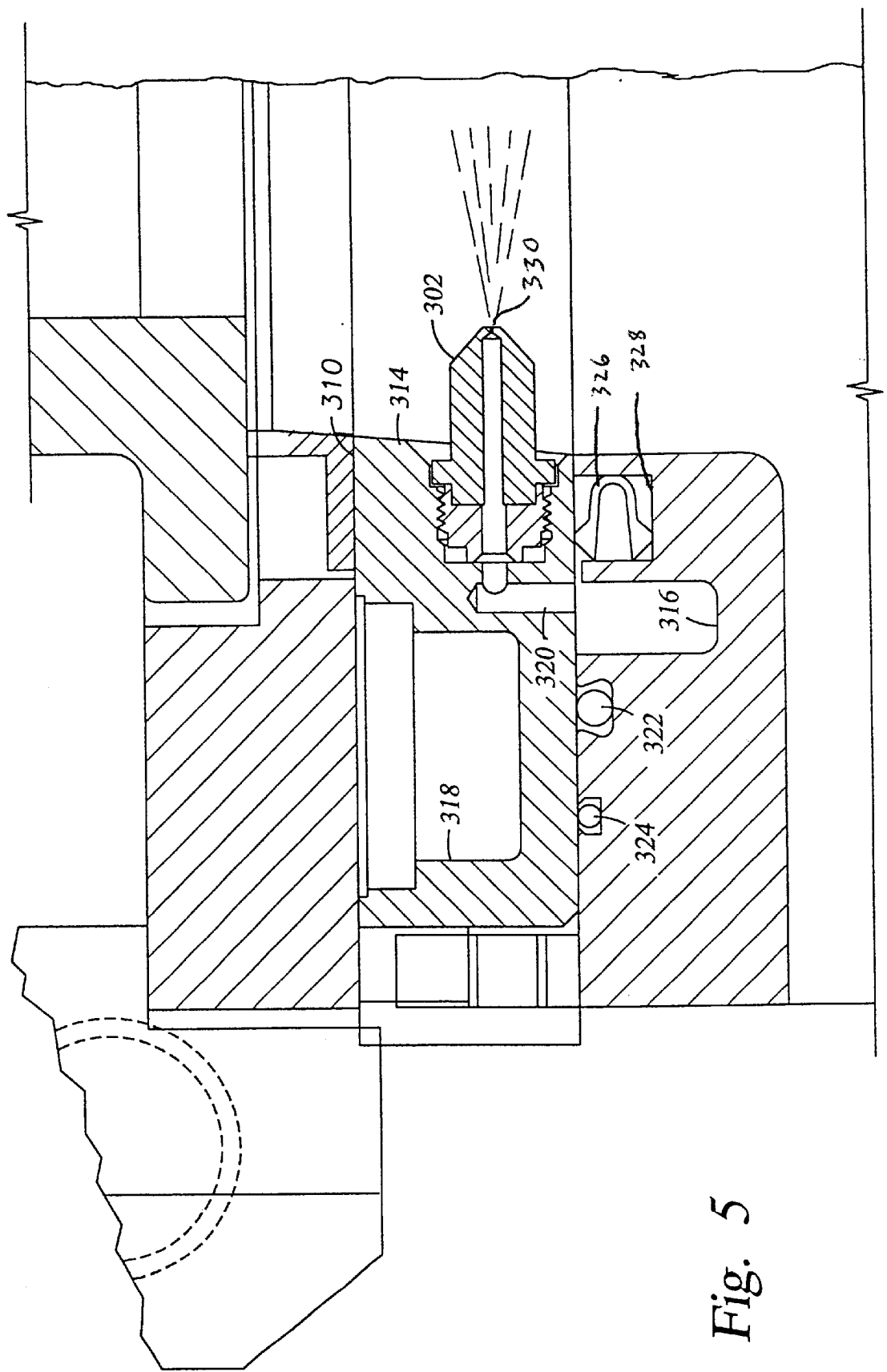
FIG. 5 is a cross-sectional view showing a first gas channel 316 connected to one port 314 having a nozzle 302 disposed therein.

FIG. 5 is a cross-sectional view showing a first gas channel 316 connected to one port 314 having a nozzle 302 disposed therein. As shown, the gas channel 316 is formed in the upper surface of the chamber body wall and is preferably annular around the entire circumference of the chamber wall. The annular gas ring has a first set of channels 320 longitudinally disposed within the ring which are connected to each of the ports 314 provided for distribution of the gas in that channel. When the gas ring is positioned over the gas channel, the passages are in communication with the channel. The gas distribution ring is sealed in the top surface of the chamber wall via two separately placed o-rings 322, 324 disposed outwardly from the channel to prevent gas leaks to the interior of the chamber. A polytetrafluoroethylene (PTFE) seal 326, such as Teflon⍱ or other similar products, is disposed inwardly of the channel in a recess 328 to prevent gas leakage into the chamber.

Referring to FIGS. 4 and 5, the nozzles 302, 304 disposed in the ports 314 are preferably threaded and mate with threads in the port to provide a seal therebetween and to provide quick and easy replacement. A restricting orifice 330 is located in the end of each nozzle and can be selected to provide the desired distribution of the gas within the chamber.

Figure 6:
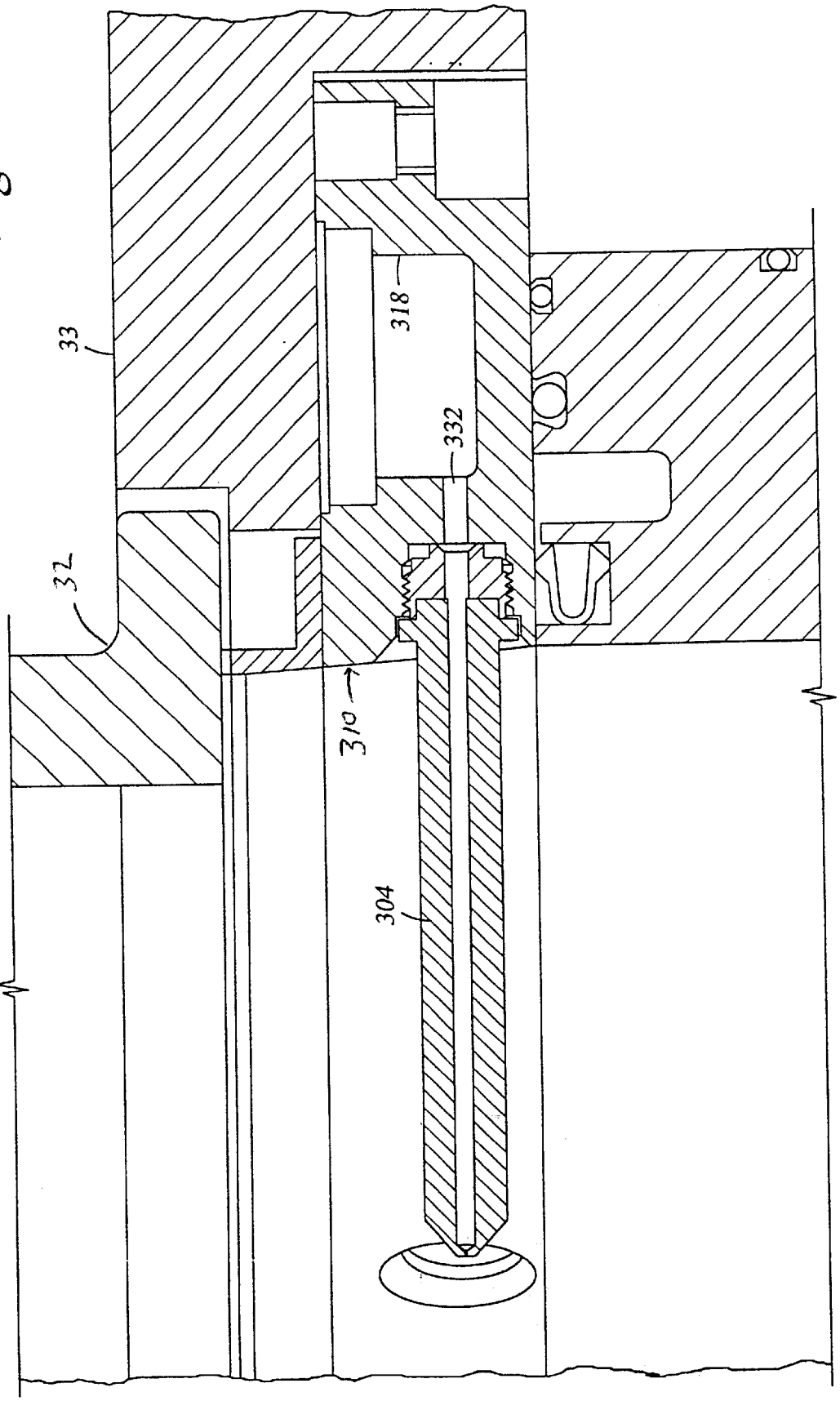
FIG. 6 is a cross-sectional view showing the second gas channel 318.

FIG. 6 is a cross-sectional view showing the second gas channel 318. The second gas channel 318 is formed in the upper portion of the annular gas distribution ring and is similarly disposed in an annular configuration around the circumference of the gas distribution ring. A horizontally disposed passage 332 connects the second gas channel to one or more ports formed in the gas ring and in which additional gas nozzles are disposed. The upper containing surface of the second gas channel is formed by the portion of the lid which supports the dome 32 and is sealed at the top by the base plate 33. The gas ring 310 is bolted to the base plate 33 which is hingedly mounted to the chamber body.

One advantage of the present invention is that the gas distribution ring can be easily removed and replaced with a ring having ports formed for receiving and positioning the tips of the nozzles at various angles so that the distribution pattern of gases can be adjusted. In other words, in certain applications it may be beneficial to angle some of the gas nozzles upwardly in the chamber, or conversely to angle some of them downwardly in the chamber. The ports formed in the gas distribution ring can be milled so that a desired angle can be selected to provide the desired process results. In addition, having at least two gas channels which can deliver at least two gases separately into the chamber allows greater control of the reaction which occurs between the various gases. Still further, reaction of the gases within the gas distribution assembly can be prevented by delivering the gases separately into the chamber.

Figure 7:
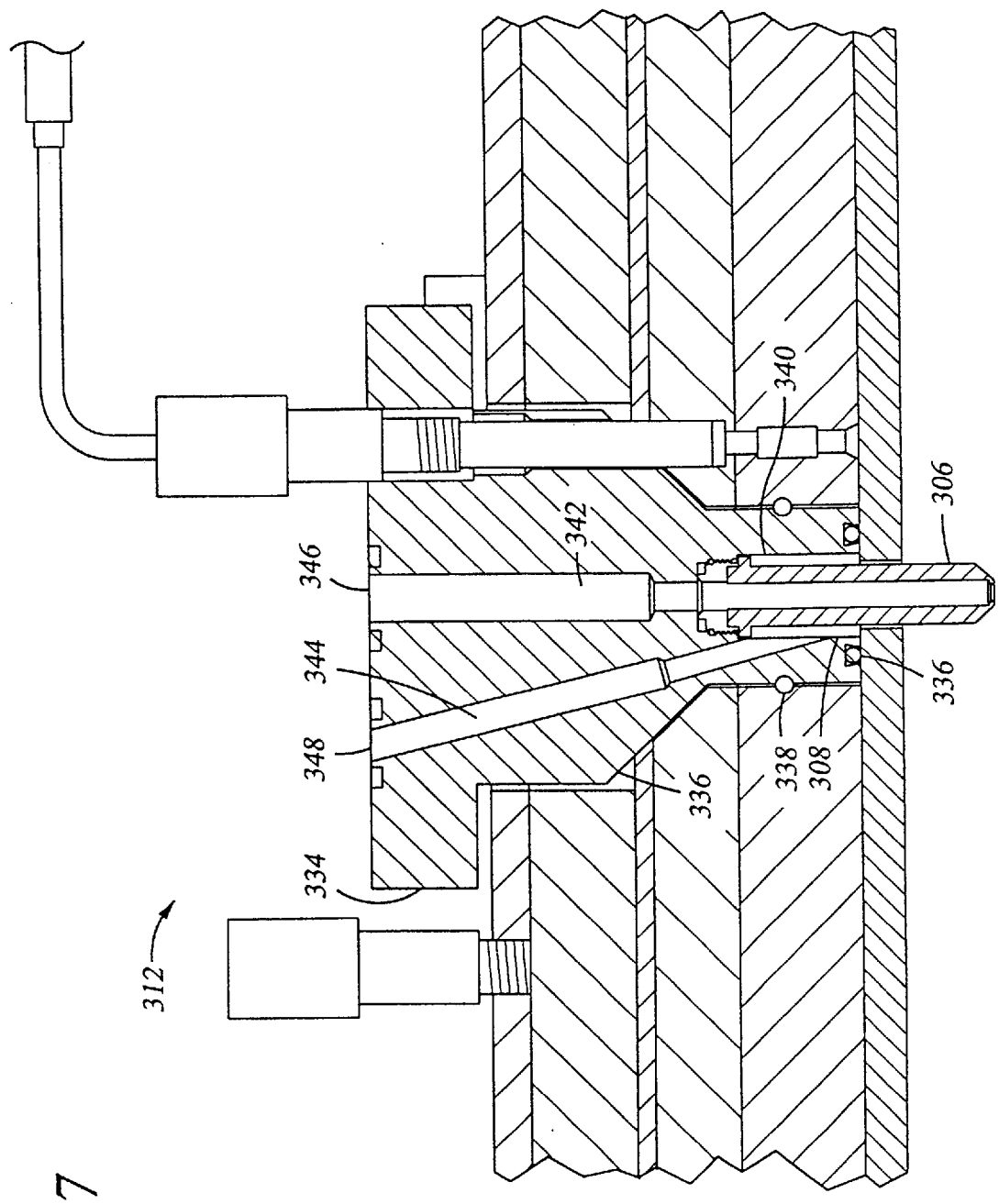
FIG. 7 is a cross-sectional view showing the center gas feed 312 disposed through the dome 32.

FIG. 7 is a cross-sectional view showing the center gas feed 312 disposed through the dome 32. The top gas feed 312 is preferably a tapered structure having a base 334 which is disposed on the top of the dome and a tapered body 336 disposed in a recess formed in the dome. Two separate o-rings 336, 338, one the lower surface of the taper body 336 and one on the side surface of the taper body 338 towards the lower end, provided sealable contact between the gas feed 312 and the dome of the chamber. A port 340 is formed in the lower portion of the body of the top gas feed to receive a nozzle 306 for delivering gases into the chamber. At least one gas passage 342 is disposed through the gas feed 310 connected to the port to deliver gases to the back of the nozzle. In addition, the nozzle 306 is tapered and the port 340 define a second gas 308 passage which delivers a gas along side of the nozzle 306 and into the chamber. A second gas channel 304 is disposed through the gas feed 312 to deliver gas into the passage 308. A gas, such as oxygen, can be delivered along side a gas such as $SiH_4$.

Figure 8:
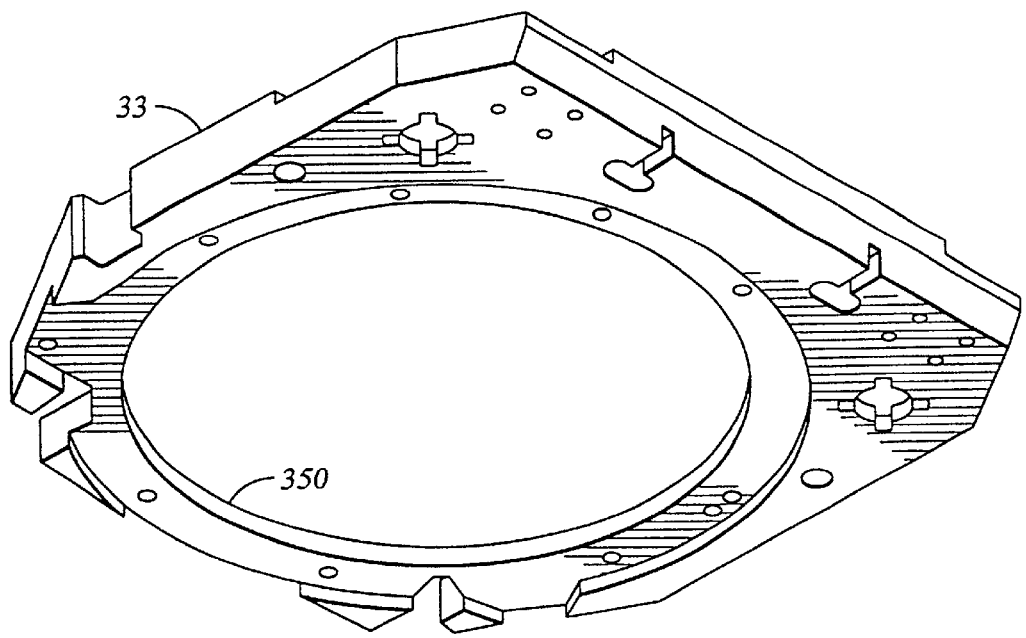
FIG. 8 is an exploded view showing the base plate 33 of the lid assembly and the gas distribution ring 310.
Figure 8:
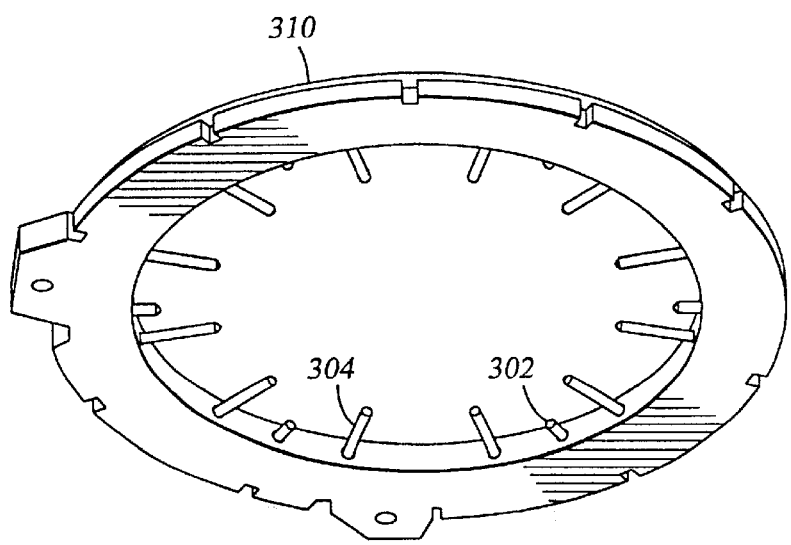

FIG. 8 is an exploded view showing the base plate 33 of the lid assembly and the gas distribution ring 310. A channel 350 is formed in the lower portion of the base plate 33 to receive the gas distribution ring 310. The gas ring 310 is bolted, or otherwise mounted, to the base plate 33. The base plate is hingedly mounted to the chamber body.

Referring back to FIG. 4, a first gas source 352 and a first gas controller 354 control entry of a first gas via line 356 into a first gas channel 316 formed in the chamber wall. Similarly, a second gas source 358 and a second gas controller 360 supply a second desired gas via line 362 into the second gas channel 318 formed in the gas distribution ring.

A third gas source 364 and a third gas controller 366 supply a third gas via line 368 to a third nozzle 306 disposed on the top of the chamber. A fourth gas source 370 and a fourth gas controller 372 supply a fourth gas via line 374 to gas passage 308. The gases introduced through the third gas nozzle and fourth gas nozzle 64 are mixed in the upper portion of chamber as both gases enter the chamber.

According to a preferred embodiment of the invention, for deposition of fluorosilica glass (FSG), oxygen is introduced into the chamber through nozzles 302 while $SiH_4$, $SiF_4$, and argon are introduced through nozzles 304. Because the nozzles 302 are shorter than the nozzles 304, and thus, closer to the interior surface of the dome, the gas introduced through the nozzles 302 creates a higher partial pressure on the interior surface of the dome that prevents the gas introduced through the longer nozzles 304 from depositing onto the interior surfaces of the dome. As applied to the FSG process gases, the higher partial pressure of oxygen at the interior surface of the dome decreases the incorporation of fluorine into the deposition on the interior surface. The length of the nozzles 302 required to provide the higher partial pressure adjacent the interior surface of the dome is determined by the length of the nozzles 304 and the flow rate of the processing gases flowing from each of the nozzles 302 and 304. Preferably, the flow rates of the process gases are between about 30 sccm and about 500 sccm for the first process gas and between about 40 sccm and about 500 sccm for the second process gas, and most preferably, the process gases are supplied into the chamber to provide an about 1:1 ratio of the gases from nozzles 302 and the gases from nozzles 304. Typically, when the flow rate of the gases from the nozzles 302 and 304 are the same, the length of the nozzles 302 compared to the length of the nozzles 304 is a ratio between about 0.24 to about 0.85. Generally, for a typical 200 mm substrate processing chamber, the length of the nozzles 304 is between about 2.55 inches and about 3.05 inches and the length of the nozzles 302 is between about 1.75 and about 2.55 inches. As an alternative, the $SiF_4$ can be introduced with the oxygen to assist in providing about a 1:1 ratio of the first and second process gases.

For a 200 mm substrate, gas flows for producing gap filling FSG layers range from 15 to 150 sccm for $SiH_4$, 15 to 150 sccm for $SiF_4$, 40 to 500 sccm for $O_2$, and 0 to 200 sccm for Ar. The flow ratio of $SiH_4$ to $SiF_4$ by volume is preferably from about 0.8:1 to about 1.2:1, and is most preferably about 1:1. The flow ratio of $O_2$ to combined $SiH_4$ and $SiF_4$ by volume is preferably about 1.5:1 to about 2:1.

Another consideration in determining the length of the nozzles 302 is that the nozzles 302 must provide sufficient gas flow to the surface of the substrate being processed to maintain process uniformity. Thus, the distance of the tips of the nozzles 302 to the substrate in relation to distance of the tips of the nozzles 304 to the substrate becomes a factor in determining the length of the nozzle 302. Typically, for a 200 mm substrate processing chamber, the tips of the nozzles 304 are disposed at between about 1 inches and about 2.5 inches vertically from a substrate disposed on the substrate support member (i.e., the distance between the plane containing the tips of the nozzles 302, 304 and the plane containing the substrate surface). For the same 200 mm chamber, the horizontal offset distance between the tips of the nozzles 302, 304 and the edge of the substrate is typically between about 0.5 inches and about 3 inches. For example, in a 200 mm substrate processing chamber where the substrate is disposed at a distance of about 1.78 inches from a plane containing the tips of the nozzles 304 and nozzles 302, the length of the nozzles 302 is about 2.55 inches while the length of the nozzles 304 is about 3.05 inches, and the horizontal offset distance of the nozzles 302 is about 1.45 inches from the edge of the substrate while the horizontal offset distance of the nozzles 304 is about 0.9 inches from the edge of the substrate. As another example, the length of the nozzles 302 is about 1.75 inches while the length of the nozzles 304 is about 2.55 inches, and the horizontal offset distance of the nozzles 302 is about 2.55 inches from the edge of the substrate while the horizontal offset distance of the nozzles 304 is about 1.45 inches from the edge of the substrate. The flow rate of the processing gases from the nozzles 302 and 304 are preferably about the same at between about 150 sccm and about 280 sccm.

As an example, a substrate is processed in the above described processing chamber for the deposition of FSG with the following parameters that result in substantially uniform deposition on the substrate and no process drifts caused by diffusion of fluorine onto the dome. The length of the nozzles 302 is 1.75 inches while the length of the nozzles 304 is 3.05 inches. The substrate is disposed at about 1.78 inches below the plane of the tips of the nozzles 302 and 304. Oxygen is introduced into the chamber through nozzles 302 at about 163 sccm $O_2$ while $SiH_4$, $SiF_4$, and argon are introduced through nozzles 304 at about 45 sccm $SiH_4$, about 45 sccm $SiF_4$, and about 73 sccm Ar. The plasma power supplied to the first coil is about 1500 W and the plasma power supplied to the second coil is about 2900 W. During the deposition process, the temperature of the substrate is maintained at about 400° C. while the temperature of the dome is maintained at 120° C. The substrate support member is biased at 1800 W. The chamber pressure is maintained at 8 mT. With the above parameters, the deposition process produces uniform and consistent FSG deposition with k values as low as 3.4. FSG films deposited are stable and satisfy all the required film properties. The hardware (i.e., ceramic dome) is not attacked by the fluorine atom, and no fluorine atoms diffused completely through the seasoning coat which was about 1000 Å thick. As a result, no process drift occurs during processing because no fluorine diffuses through to form $Al_2O_xF_y$ on the dome.

Figure 9:
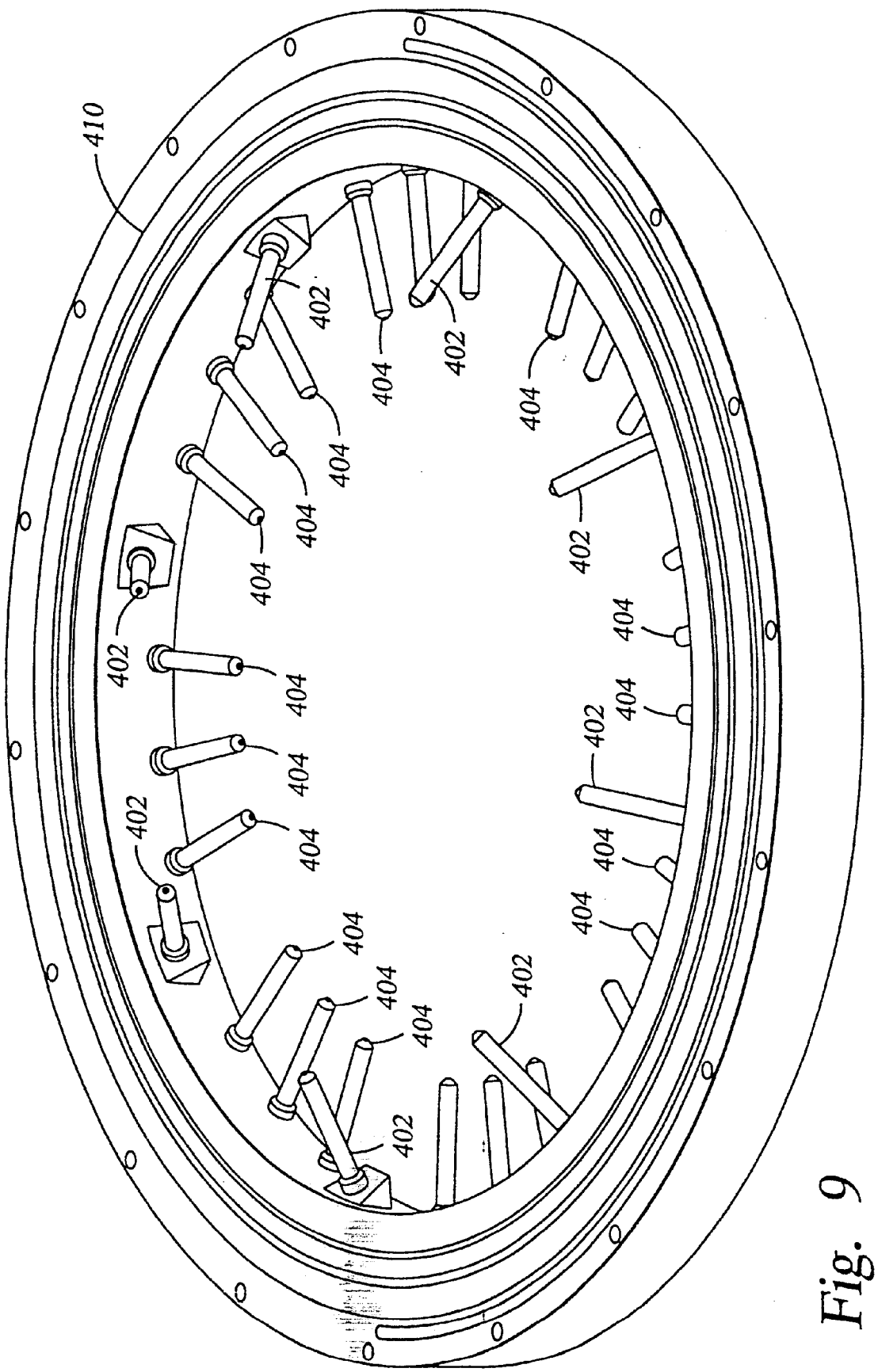
FIG. 9 is a perspective view of an alternative embodiment of a gas distribution ring 410 according to the invention.

FIG. 9 is a perspective view of an alternative embodiment of a gas distribution ring 410 according to the invention. The multi-level gas distribution ring 410 is generally similar in construction to the gas distribution ring 310 except for the configuration of the gas nozzles 402 and 404. The gas distribution ring 410, as shown in FIG. 9, includes a first set of nozzles 404 that are similar to the long nozzles 304 and a second set of nozzles 402 that are tilted at an angle toward the chamber dome. The nozzles 402 and 404 are disposed in an alternating arrangement wherein three nozzles 404 are disposed between adjacent tilted nozzles 402. The first set of nozzles 404 are connected to a first annular channel (not shown) formed within the gas distribution ring 410 while the second set of nozzles 402 are connected to a second annular channel (shown in FIG. 10) formed within the gas distribution ring. Although FIG. 9 shows the preferred arrangement of the nozzles 402 and 404, other arrangements of the nozzles to provide a desired multi-level gas distribution are contemplated by the present invention.

Figure 10:
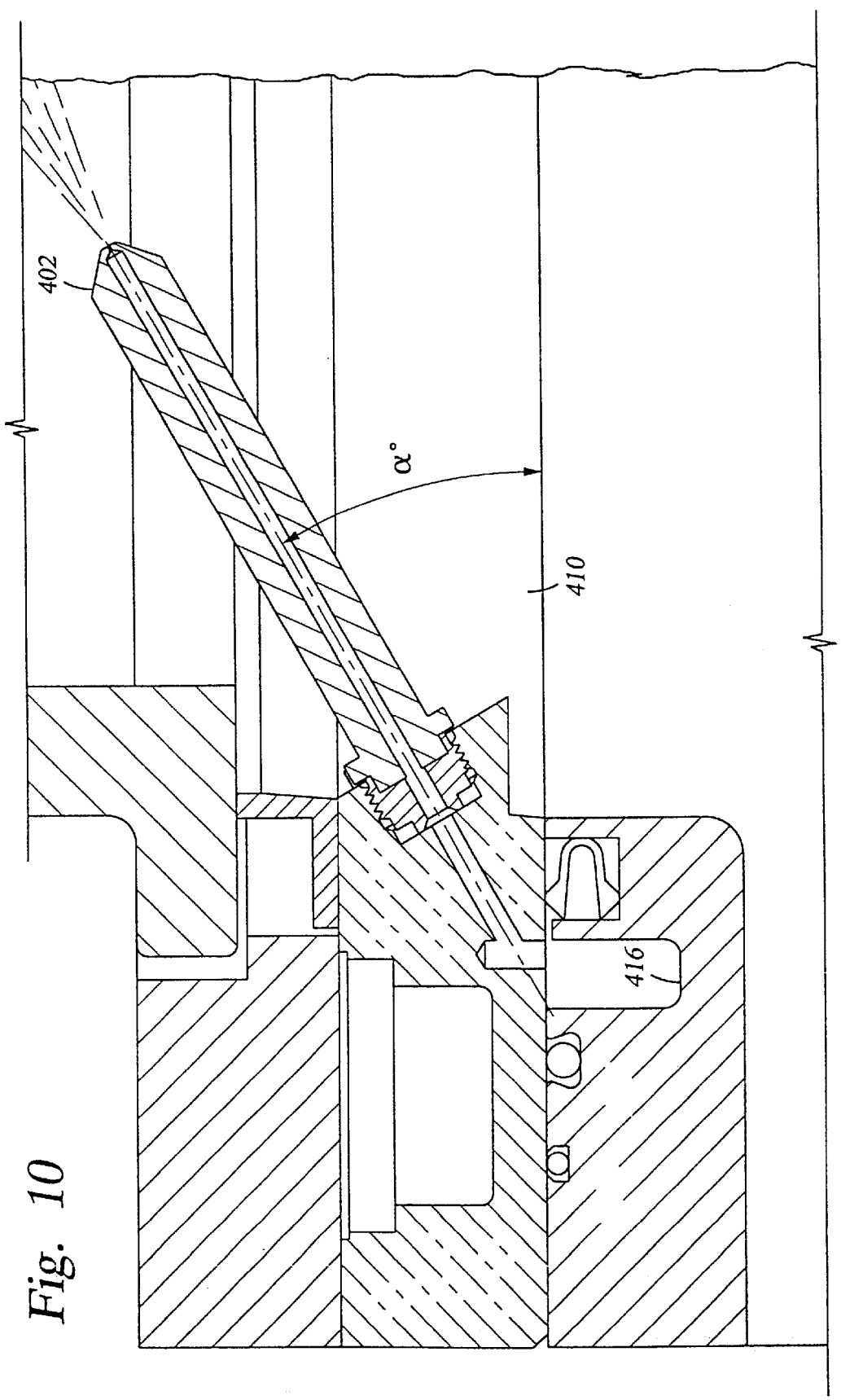
FIG. 10 is a partial cross-sectional view of a multi-level gas distribution ring 410 showing a second annular gas channel 416 and a tilted nozzle 402.

FIG. 10 is a partial cross-sectional view of the gas distribution ring 410 showing the second annular gas channel 416 and a tilted nozzle 402. Preferably, the angle of tilt, α, measured from the plane containing the gas distribution ring 410, is between about 15 degrees and about 60 degrees, angled toward the chamber dome. As shown in FIG. 10, the angle α is about 45 degrees. Another alternative embodiment of the invention provides a first set of nozzles 404 that are tilted in an opposite direction (i.e., toward the substrate) from the tilt of the second of nozzles 402. Preferably, the tilt of the first set of nozzles 404 is between about 0 degrees and about −25 degrees from the plane containing the gas distribution ring 410 (i.e., the tilt is between about 0 degrees and about 25 degrees towards the substrate).

The multi-level gas distribution ring 410 introduces the processing gas into the processing chamber with a center thick diffusion pattern for the process gas introduced through the tilted nozzles 402. According to this embodiment, for deposition of fluorosilica glass (FSG), $SiF_4$ and oxygen are introduced into the chamber through nozzles 404 while $SiH_4$ and argon are introduced through nozzles 402. Because of the center thick diffusion pattern, silicon oxide dopants, such as fluorine and phosphorous, become more uniformly distributed across the surface of the substrate, resulting in an improved uniformity of deposition.

The multi-level gas distribution ring 410 also achieves the same goal as the gas distribution ring 310 in preventing fluorine attack of the ceramic dome because the process gas introduced through the tilted nozzles 402 provide a higher partial pressure near the surface of the ceramic dome than the process gas introduced through the nozzles 404. For example, as applied to the FSG process gases above, the higher partial pressure of $SiH_4$ at the interior surface of the dome decreases the incorporation of fluorine into the deposition on the interior surface, resulting in preventing blackening of the dome by the fluorine species, which in turn prevents process drifts in the uniformity of deposition, deposition rate, fluorine content in the chamber during processing and the sputter uniformity. Another advantage of the multi-level gas distribution ring 410 is that the seasoning coat is deposited at a faster rate because of the reduced distance between the ceramic dome's interior surface and the nozzles for introducing the seasoning gas.

While the foregoing is directed to the preferred embodiment of the present invention, other and further embodiments of the invention may be devised without departing from the basic scope thereof, and the scope thereof is determined by the claims that follow.

What is claimed is:

1. A method for depositing a film on a substrate in a chemical vapor deposition chamber, comprising:
   a) introducing a first reactant gas through a first gas inlet at a first distance from an interior surface of the chamber;
   b) introducing a second reactant gas through a second gas inlet at a second distance from the interior surface of the chamber, wherein the second reactant gas creates a higher partial pressure adjacent the interior surface of the chamber to prevent deposition from the first reactant gas on the interior surface; and
   c) generating a plasma of the processing gases.

2. The method of claim 1, further comprising:
   d) coating the interior surface of the chamber with a seasoning coat before step a).

3. The method of claim 1, wherein a ratio of the second distance to the first distance is between about 0.24 and about 0.85.

4. The method of claim 1, wherein the first reactant gas is introduced at a different angle from the second reactant gas with respect to a substrate surface.

5. The method of claim 4, wherein the second reactant gas is introduced at an angle toward the dome of the deposition chamber.

6. The method of claim 4, wherein the first reactant gas is introduced at an angle toward the substrate.

7. The method of claim 1, wherein the first reactant gas comprises a silicon-containing gas and the second reactant gas comprises an oxygen-containing gas.

8. The method of claim 7, wherein the first reactant gas further comprises a fluorine-containing gas.

9. The method of claim 8, wherein the first reactant gas further comprises an inert gas.

10. The method of claim 9, wherein the silicon-containing gas comprises $SiH_4$, the fluorine-containing gas comprises $SiF_4$, the inert gas comprises argon, and the oxygen-containing gas comprises oxygen.

11. The method of claim 1, wherein the first reactant gas comprises a fluorine-containing gas and the second reactant gas comprises a silicon-containing gas.

12. The method of claim 11, wherein the first reactant gas further comprises an oxygen-containing gas.

13. The method of claim 12, wherein the second reactant gas further comprises an inert gas.

14. The method of claim 13, wherein the fluorine-containing gas comprises $SiF_4$, the silicon-containing gas comprises $SiH_4$, the oxygen-containing gas comprises oxygen, and the inert gas comprises argon.

15. A method for depositing a film onto a substrate within a deposition chamber, comprising:
   injecting a first process gas comprising a silicon-containing gas and a fluorine-containing gas into the chamber through a plurality of first nozzles surrounding the substrate; and
   injecting a second process gas comprising an oxygen-containing gas into the chamber through a plurality of second nozzles surrounding the substrate;
   wherein the plurality of second nozzles inject the second process gases closer to an interior surface of the chamber than the plurality of first nozzles inject the first process gas.

16. The method according to claim 15, wherein the first process gas further comprises an inert gas.

17. The method of claim 16, wherein the silicon-containing gas comprises $SiH_4$, the fluorine-containing gas comprises $SiF_4$, the inert gas comprises argon, and the oxygen-containing gas comprises oxygen.

18. The method according to claim 15, wherein the silicon-containing gas and the fluorine-containing gas are injected at a flow ratio of from about 0.8:1 to about 1.2:1 by volume.

19. The method according to claim 18, wherein the flow ratio of the silicon-containing gas and the fluorine-containing gas is about 1:1.

20. The method of claim 15, wherein the first process gas and the second process gas are injected at a flow ratio of about 1:1 by volume.

21. The method of claim 15, the fluorine-containing gas is injected into the chamber at a rate between about 15 sccm and 150 sccm, the silicon-containing gas is injected into the chamber at a rate between about 15 sccm and 150 sccm, and the oxygen-containing gas is injected into the chamber at a rate between about 40 sccm to about 500 sccm.

22. The method according to claim 21, wherein the oxygen-containing gas is injected at a flow ratio to the silicon-containing gas and the fluorine-containing gas of about 1.5:1 to about 2:1 by volume.

23. The method according to claim 21, further comprising injecting from 0 to 200 sccm of an inert gas into the chamber.

24. The method according to claim 23, wherein the inert gas is injected through the first nozzles.

25. The method of claim 23, the wherein the silicon-containing gas comprises $SiH_4$, the fluorine-containing gas comprises $SiF_4$, the inert gas comprises argon, and the oxygen-containing gas comprises oxygen.

26. The method according to claim 15, wherein the first nozzles are longer than the second nozzles.

27. The method of claim 15, wherein the first process gas is introduced at a different angle from the second process gas with respect to a substrate surface.

28. The method of claim 27, wherein the second process gas is introduced at an angle toward the dome of the deposition chamber.

29. The method of claim 27, wherein the first process gas is introduced at an angle toward the substrate.

30. A method for distributing processing gases in a processing chamber, comprising:
   a) introducing a first gas comprising a fluorine-containing gas through a first gas inlet at a first distance from an interior surface of the chamber; and
   b) introducing a second gas through a second gas inlet at a second distance from the interior surface of the chamber, wherein the second gas creates a higher partial pressure adjacent the interior surface of the chamber to prevent deposition from the first gas on the interior surface.

31. The method of claim 30 wherein the first gas further comprises an oxygen-containing gas and the second gas comprises a silicon-containing gas.

32. The method of claim 31, wherein the second gas further comprises an inert gas.

33. The method of claim 32, wherein the fluorine-containing gas comprises $SiF_4$, the oxygen-containing gas comprises oxygen, the silicon-containing gas comprises $SiH_4$, and the inert gas comprises argon.

34. The method of claim 30, wherein the first gas comprises a silicon-containing gas and the second gas comprises an oxygen-containing gas.

35. The method of claim 34, wherein the first gas further comprises an inert gas.

36. The method of claim 35, wherein the silicon-containing gas comprises $SiH_4$, the oxygen-containing gas comprises oxygen, the fluorine-containing gas comprises $SiF_4$, and the inert gas comprises argon.

37. The method of claim 30, wherein a ratio of the second distance to the first distance is between about 0.24 and about 0.85.

38. The method of claim 30, wherein the first gas is introduced at a different angle from the second gas with respect to a substrate surface.

39. The method of claim 38, wherein the second gas is introduced at an angle toward the dome of the deposition chamber.

40. The method of claim 38, wherein the first gas is introduced at an angle toward the substrate.

41. A method for distributing processing gases in a processing chamber, comprising:
   a) introducing a first gas through a first gas inlet; and
   b) introducing at an angle toward the dome of the deposition chamber a second gas through a second gas inlet, wherein the second gas creates a higher partial pressure adjacent the interior surface of the dome of the deposition chamber to prevent deposition from the first gas on the interior surface.

42. A method for depositing a film over a substrate in a chemical vapor deposition chamber, comprising:
   step for creating a higher partial pressure of a second reactant gas in relation to a first reactant gas comprising a fluorine-containing gas adjacent an interior surface of the chamber to prevent deposition of the first reactant gas on the interior surface; and
   step for depositing material from the first gas and the second gas to form the film over the substrate.

43. The method of claim 42, wherein the second reactant gas comprises a silicon-containing gas.

44. The method of claim 43, wherein the first reactant gas further comprises an oxygen-containing gas.

45. The method of claim 44, wherein the second reactant gas further comprises an inert gas.

46. The method of claim 45, wherein the fluorine-containing gas comprises $SiF_4$, the silicon-containing gas comprises $SiH_4$, the oxygen-containing gas comprises oxygen, and the inert gas comprises argon.

47. The method of claim 42, wherein the second reactant gas comprises an oxygen-containing gas.

48. The method of claim 47, wherein the first reactant gas further comprises a silicon-containing gas.

49. The method of claim 48, wherein the first reactant gas further comprises an inert gas.

50. The method of claim 49, wherein the fluorine-containing gas comprises $SiF_4$, the oxygen-containing gas comprises oxygen, the silicon-containing gas comprises $SiH_4$, and the inert gas comprises argon.

51. The method of claim 42, wherein the interior surface of the chamber comprises a chamber dome.

* * * * *

UNITED STATES PATENT AND TRADEMARK OFFICE
CERTIFICATE OF CORRECTION

| | | |
|---|---|---|
| PATENT NO. | : 6,486,081 B1 | |
| DATED | : November 26, 2002 | |
| INVENTOR(S) | : Ishikawa et al. | |

It is certified that error appears in the above-identified patent and that said Letters Patent is hereby corrected as shown below:

Title page,
Item [63], please change "09/191,346" to -- 09/191,364 --.

Column 6,
Line 15, please change "($A_2O_3$)" to -- $Al_2O_3$ --.

Column 10,
Line 3, please change "Teflomʋ" to -- Teflon$^{TM}$ --.

Signed and Sealed this

Second Day of September, 2003

JAMES E. ROGAN
*Director of the United States Patent and Trademark Office*